United States Patent
Kawas et al.

[11] Patent Number: 6,058,262
[45] Date of Patent: May 2, 2000

[54] COMPUTER-AIDED-DESIGN METHOD AND APPARATUS FOR NETWORKS

[75] Inventors: Percy Kawas, Los Altos; Yiftah Porat, Sunnyvale, both of Calif.

[73] Assignee: GearGarage.com Inc., Palo Alto, Calif.

[21] Appl. No.: 08/844,080

[22] Filed: Apr. 18, 1997

[51] Int. Cl.[7] .................................................. G06F 17/50
[52] U.S. Cl. ..................................................... 395/500.34
[58] Field of Search ............................... 364/512, 500.34

[56] References Cited

U.S. PATENT DOCUMENTS

| | | | |
|---|---|---|---|
| 5,274,643 | 12/1993 | Fisk | 370/238 |
| 5,809,282 | 9/1998 | Cooper et al. | 395/500.34 |
| 5,831,610 | 11/1998 | Tonelli et al. | 345/335 |

FOREIGN PATENT DOCUMENTS

| | | |
|---|---|---|
| 2294340A | 4/1996 | United Kingdom . |
| WO9301557A | 1/1993 | WIPO . |
| WO9602882A | 2/1996 | WIPO . |
| WO9628784A | 9/1996 | WIPO . |

*Primary Examiner*—Kevin J. Teska
*Assistant Examiner*—Hugh Jones
*Attorney, Agent, or Firm*—Fliesler, Dubb, Meyer & Lovejoy

[57] ABSTRACT

A computer-aided-design method and apparatus for generating a design of desired products, and selecting products to implement the design of a network. The method, as performed by the computer, includes the step of (1) retrieving a number of network infrastructure specifications, (2) retrieving a number of networking rules, (3) generating a design that defines characteristics in the desired products of the network, and (4) selecting a number of networking products from a storage medium to implement the design of the network. The infrastructure includes a number of physical locations to house the network, with the design at least being based on the infrastructure specifications. The selection process is based on the rules and the infrastructure specifications. Note that in one embodiment, the implementation at least specifies one communication characteristic between two of the products to be housed in two physical locations. One apparatus for the invention includes an input device, a processing device, a storage medium, a report generation device and a graphics generation device.

28 Claims, 10 Drawing Sheets

RULES
- POWER REQUIREMENT *352*
- EQUIPMENT SPECIFIC ELECTRICAL CHARACTERISTICS *356*
- EQUIPMENT SPECIFIC MECHANICAL CHARACTERISTICS *358*

FIG. 6

3C16406 : SuperStack II PS Hub
|
3C1206-5 : 10 BASE-FL TRANSCEIVER INTERFACE MODULE

FIG. 7

OPTIMIZATION CHARACTERISTICS
- MINIMIZE COST *400*
- MINIMIZE THE NUMBER OF NETWORKING EQUIPMENTS *402*

FIG. 8

Assembly Report

*For   Pauls Bank*

*Diagram displays relationships between Chassis, Slots, and Module cards*

---

NY Division-Building 001-Floor 001-Wiring Closet 001

8 ft. x 19 in. rack, #1 in Wiring Closet

SuperStack II

3C16420:  SuperStack II PS Hub Cascade Cable 30 cm

3C16420:  SuperStack II PS Hub Cascade Cable 30 cm

3C16406,2 Rack Units:  SuperStack II PS Hub 40 TP 24-Port

3C1206-5, Slot #1:  10BASE-FL Transceiver Interface Module

3C16406,4 Rack Units:  SuperStack II PS Hub 40 TP 24-Port

3C16405,6 Rack Units:  SuperStack II PS Hub 40 TP 12-Port

SuperStack II

3C16420:  SuperStack II PS Hub Cascade Cable 30 cm

3C16420:  SuperStack II PS Hub Cascade Cable 30 cm

3C16406,8 Rack Units:  SuperStack II PS Hub 40 TP 24-Port

3C1206-5, Slot #1:  10BASE-FL Transceiver Interface Module

3C16406,10 Rack Units:  SuperStack II PS Hub 40 TP 24-Port

3C16405,12 Rack Units:  SuperStack II PS Hub 40 TP 12-Port

SuperStack II

*FIG. 9*

Assembly Report Parts Index

For Pauls Bank

---

| | |
|---|---|
| 3C1206-5 | 10BASE-FL Transceiver Interface Module |
| 3C16405 | SuperStack II PS Hub-40 TP 12-Port |
| 3C16406 | SuperStack II PS Hub-40 TP 24-Port |
| 3C16901A | SuperStack II Switch 1000 12-Port |
| 3C16940A | SuperStack II Switch 3000 FX |

Bill Of Materials - Per Location
For Quote Pauls Bank, RO with Enet (100M
 For Customer  Morgan Bank Total for Solution  1:  $329,108

Total for Location NY Division-Building 001-Floor 001-Wiring Clo  :  $54,410

| Model | Count | Total | Unit | Description |
|---|---|---|---|---|
| 3C96140M-TP | 2 | $13,990 | $6,995 | COREBuilder 5000 40 port Ethernet 10 Base T Module with RJ 45 ports |
| 3C8427C | 3 | $11,985 | $3,995 | SuperStack II Netbuilder 427 router-all protocols with 1 E1/T1 and 1 ISDN |
| 3C16940A | 1 | $8,995 | $8,995 | SuperStack II Switch 3000 FX |
| 3C16406 | 4 | $5,356 | $1,339 | SuperStack II PS Hub 40 TP 24-Port |
| 3C96120M-TPP | 1 | $4,195 | $4,195 | COREBuilder 5000 20 port Ethernet 10Base -T Module with RJ 45 ports |
| 3C16901A | 1 | $3,350 | $3,350 | SuperStack II Switch 1000 12-Port |
| 3C96000M-RCTL | 1 | $1,995 | $1,995 | COREBuilder 5000 Fault Tolerant Module |
| 3C16405 | 2 | $1,518 | $759 | SuperStack II PS Hub 40 TP 12-Port |
| 3C96100D-MGT | 1 | $1,495 | $1,495 | COREBuilder 5000 Ethernet Network Monitor Card |
| 3C96007CH-A | 1 | $995 | $995 | COREBuilder 5000 7 Slot Integrated ONcore System with TRiChannel, RingChannel and FastChannel Backplanes |
| 3C1206-D | 4 | $340 | $85 | AUI Transceiver Interface Module |
| 3C16420 | 4 | $196 | $49 | SuperStack II PS Hub Cascade Cable 30 cm |

SC1-Building 001-Floor 001-Wiring Closet 001

8'x19"rack

FIG. 12

COMPUTER-AIDED-DESIGN METHOD AND APPARATUS FOR NETWORKS

BACKGROUND OF THE INVENTION

The present invention relates generally to computer-aided designs for computer networks, and more particularly to computer-aided approach to design and select products to implement the design of a network, based on infrastructure specifications of the network.

With the proliferation of computers, users have been demanding to have their computers connected so that information can flow seamlessly among them. Such demands have led to the unbelievable growth of the networking industry. For the past five years, sales from the top 5 networking companies have grown over 27 times. Typically, large networking manufacturers are more risk averse and are not as innovative as small companies. Thus, to sustain the growth, many large networking companies have been buying smaller companies. For example, since 1993, Cisco has bought 13 companies and invested in 7 others for more than $6 billion dollars.

According to numerous forecasts, the growth of the networking industry may not be ebbing, especially due to the pervasiveness of the Internet and the World Wide Web. On the contrary, the growth rate might even increase. To counteract the dominance of Microsoft, a number of companies, including IBM, Oracle and Cisco, have invested heavily into a computing environment based on a thin-client, which is a computer without a harddisk and with all of its major software applications pushed from a server computer. At the expense of accessories and capabilities, a thin-client computer is relatively inexpensive. In order for a thin-client to provide sufficient functionalities to satisfy typical users, it is networked to more powerful servers. If these revolutionary changes become the industry standard, the sales of the networking companies will further increase significantly.

Many companies see the need to network their computers, or to enhance the performance of their existing network. Typically, a company employee knows at least broadly the problem he has to solve, which might be as simple as providing a computer in each room of a building, with all of the computers networked and managed by a central server. With thousands and thousands of networking products flooding the industry, he is facing a daunting task to select the right products and to determine the approaches to interconnect them. Not only is the sheer number of networking products soaring, the complexities in the products are also increasing, further increasing the difficulties in the design process.

Due to the large number of choices a customer has to make, if he has to select the networking products himself, it is not uncommon for him to end up with a faulty network. His normal approach is to pick a reputable networking company, ask them to send a sales engineer to analyze the problem and to provide a quote. Recently, a company in Quala Lumpur (the "QL company") wanted to provide computers for thousands of users in a 80-floor building. That company solicited quotes from one of the top networking companies, which sent at least four sales engineers to tackle the problem. They spent more than a month to generate the bills of materials, drawings of the network and the quote, with products selected from their own company, without considering products from any other networking companies. As shown by the above example, to design and to select products to implement the design of a network is a difficult and time consuming task, which does not seem to be getting any easier. Thus, there is a constant need for more networking talent. As a result, on one specific day in 1996, Cisco had more than 2000 technical or networking professional job openings!.

The four sales engineers in the above example were from a large networking company with thousands of employees. Imagine if the QL company approached a typical reseller with only twenty employees, due to the reseller's limited resources and expertise, it is probable that the QL company will receive from the reseller a sub-optimal solution to its problem. However, studies indicate that in order to increase the penetration of networking products into the technology industry, more than 50% of the products will be sold by resellers. Apparently, more networking talent may not be able to efficiently solve the difficult problem of designing a network and selecting products to implement the design.

Obviously there is a need for some types of productivity tools that can help a user with minimal networking experience to design a network and to select products to correctly implement the design.

SUMMARY OF THE INVENTION

The present invention provides a computer-aided method and apparatus to automatically design and select products to implement the design of a network. Based on the present invention, a user with minimal networking experience can generate the design, and select products at a speed that is orders of magnitude faster than any prior art approach. Also the design implemented can be optimized under different pre-selected constraints.

To implement the present invention, in one embodiment, a computer retrieves a number of infrastructure specifications of the network from a storage medium. These specifications include, for example, the physical locations to house the network, such as the number of sites, buildings in each site, floors in each building; and whether the network has a collapsed or distributed backbone. The user can enter the specifications. If not entered, the computer can use default values for some of the specifications.

The computer then retrieves a set of networking rules, and one or more networking optimization constraints. One set of rules relates to the electrical characteristics of networking products; another determines power requirements by products in the network. One optimization constraint can be that the design implemented is of substantially the minimal cost.

Based on a number of networking rules and the specifications, the computer generates a design that defines characteristics in the desired products of the network. For example, one desired product has the characteristics of a 12-port hub with a uninterrupted power system.

The computer then checks the characteristics in each of the desired products in the design to decide whether there are products in a database that can satisfy them. If some characteristics cannot be satisfied, the computer can ask the user to change the specifications. After checking the design, the computer selects all of the networking products from the database that satisfy the characteristics, based on the rules and the specifications. In one embodiment, the implementation of the design at least specifies one communication characteristic between two of the products to be housed in two physical locations.

Based on the selection, the computer can generate a network assembly diagram, which can go to the port level, to depict the network. The computer can also generate reports, such as a bill of materials for the network, with cost details of the selected networking products and the part numbers to order them.

After selecting the networking products, the computer can also repeat to generate an alternative design if the user modifies the designed network, or if the user provides additional specifications for the desired network.

The present invention has been applied to solve the problem of the QL company, which wanted to have computers for thousands of users in a 80-floor building. The computer used by the present invention was a Pentium 166 PC with 32 MB RAM and 100 MB harddisk. It took a user about 15 minutes to enter infrastructure specifications into the computer, and about 1 hour and 15 minutes to solve the problem, generating a bill of materials and a set of network assembly diagrams. In order to compare performance, for that specific application, the present invention selected products only from that large networking company. The solutions generated were almost identical to the solutions provided by more than four sales engineers who spent more than one month to solve the problem, except the quote offered by the present invention was less expensive.

Other aspects and advantages of the present invention will become apparent from the following detailed description, which, when taken in conjunction with the accompanying drawings, illustrates by way of example the principles of the invention.

Same numerals in FIGS. 1–12 are assigned to similar elements in all the figures. Embodiments of the invention are discussed below with reference to FIGS. 1–12. However, those skilled in the art will readily appreciate that the detailed description given herein with respect to these figures is for explanatory purposes as the invention extends beyond these limited embodiments.

DETAILED DESCRIPTION OF THE INVENTION

Figure 1:
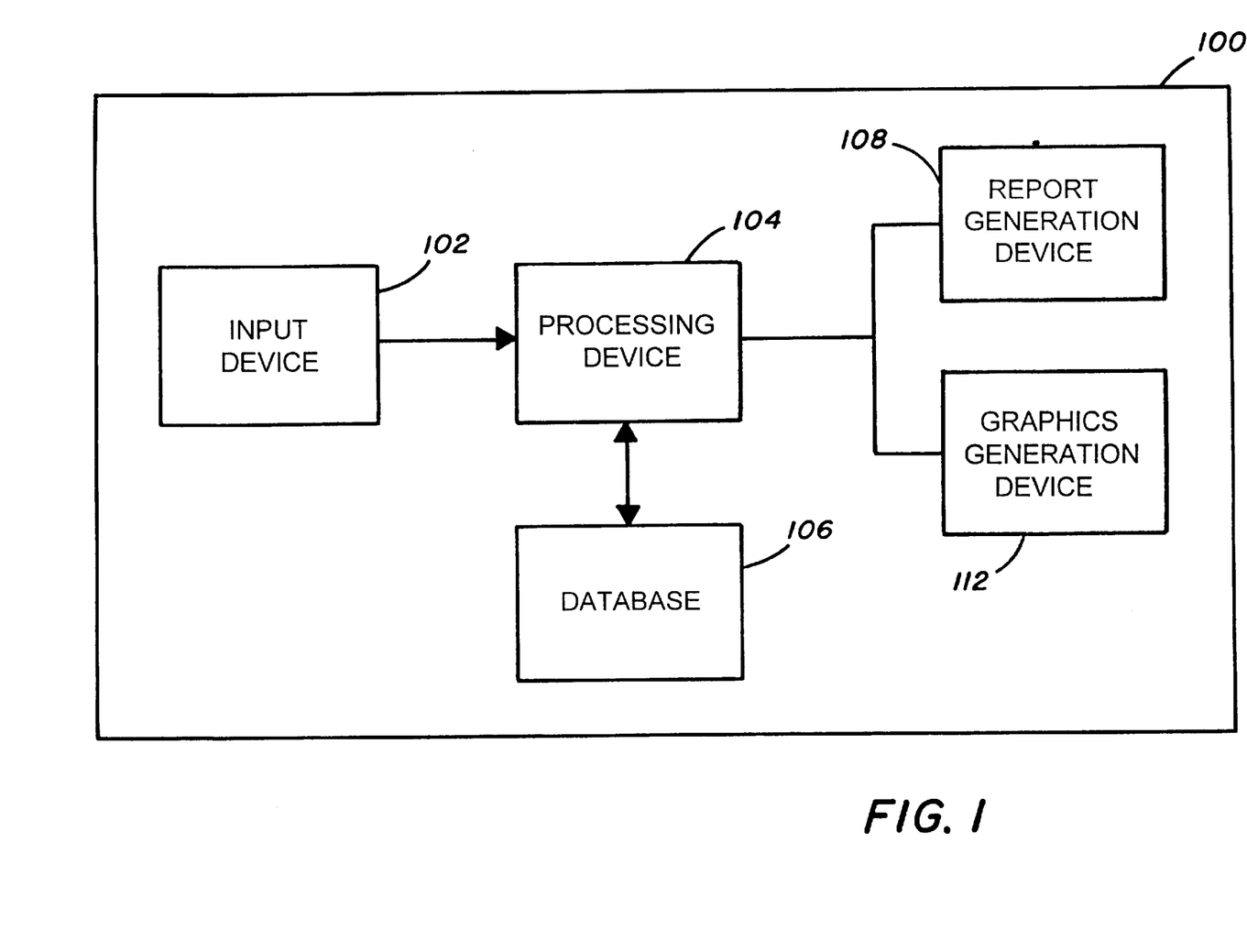
FIG. 1 shows a computer that implements the present invention.

FIG. 1 shows a computer 100 that implements the present invention. The apparatus includes an input device 102, a processing device 104, a database 106 in a storage medium, a report generation device 108 and a graphics generation device 112. The devices can be implemented in numerous ways. For example, the computer can be a portable computer, a desktop computer, a mainframe computer or a handheld computer such as a personal digital assistant; the input device 102 can be a keyboard, a voice-recognition device or a position-pointing device; the processing device 104 can be a microprocessor or a re-configurable programmable logic array; the database 106 can be a relationship database or object-oriented database; and both the report generation device 108 and the graphics generation device 112 can be a monitor or a printer with different software for each device. The storage medium can be a harddisk. The input and output devices, such as the graphics generation device 112, can be implemented through web-based technology, such as a browser with the corresponding plug-ins. In one embodiment, the computer 100 is a Pentium 100 PC with at least 32 MB of RAM, at least 100 MB of harddisk space and a VGA monitor in a Windows 95 environment.

Figure 2:
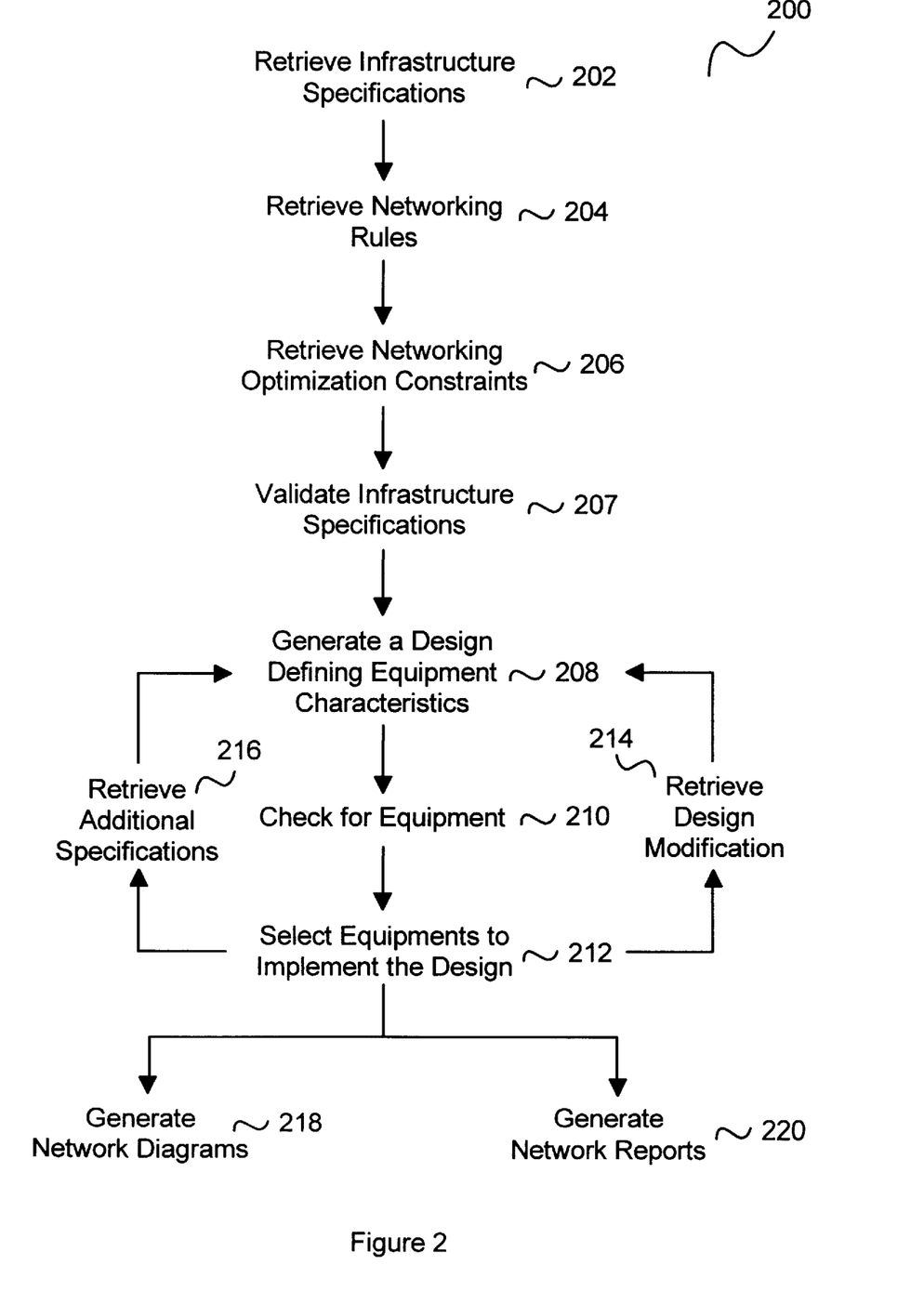
FIG. 2 shows one set of steps to implement the present invention.
Figure 3:
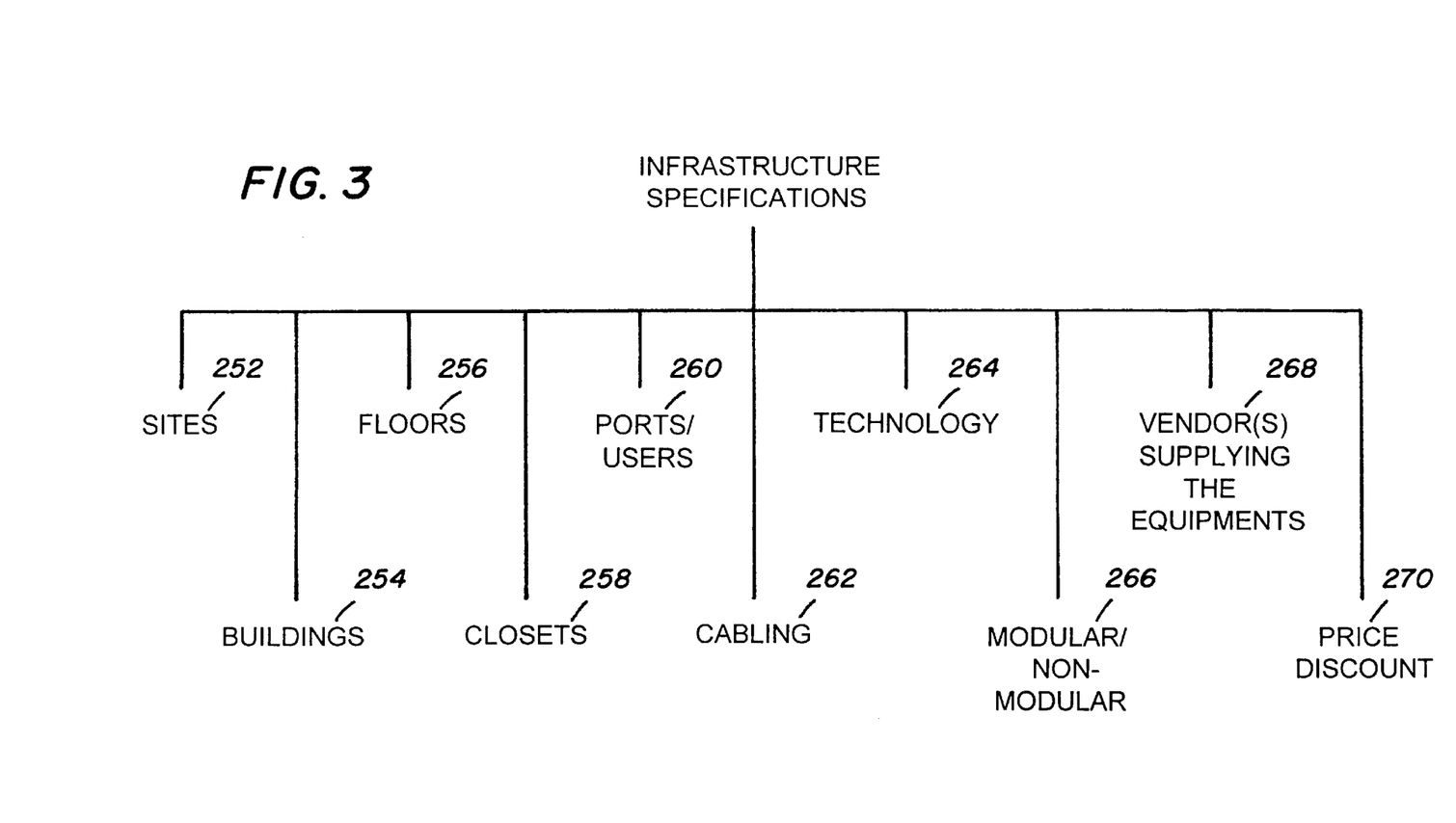
FIG. 3 shows examples of infrastructure specifications for the present invention.

FIG. 2 shows one set 200 of steps to implement the present invention. First the processing device 104 retrieves (step 202) a number of infrastructure specifications of the network from the database 106. FIG. 3 shows examples for the present invention. One type of infrastructure specification is the physical locations to house the network. They can be the number of sites 252, which can be in diverse geographical areas, such as one site in New York and another in Los Angeles; the number of buildings 254; the number of floors 256 in each building; and the number of closets 258 on each floor. Other infrastructure specifications include the number of ports 260 per closet; the type of cabling 262, such as twisted pair or fiber optics; the type of networking technology 264, such as Ethernet, ATM or FDDI; whether the network is built on a collapsed or a distributed backbone; whether the products are modular or non-modular 266; the vendor(s) supplying the products; and the maximum price discounts for the products 270, which can be useful because sales engineers at different levels of responsibility might have the permission for different amount of discounts.

A user can enter the infrastructure specifications through the input device 102 into the computer 100. If some of the specifications have not been entered, the computer 100 will use default values for them. For example, if the user has not entered the price discount for the products, the default value will be zero; if the vendor has not been specified, products from a number of vendors can be used.

Figure 4:
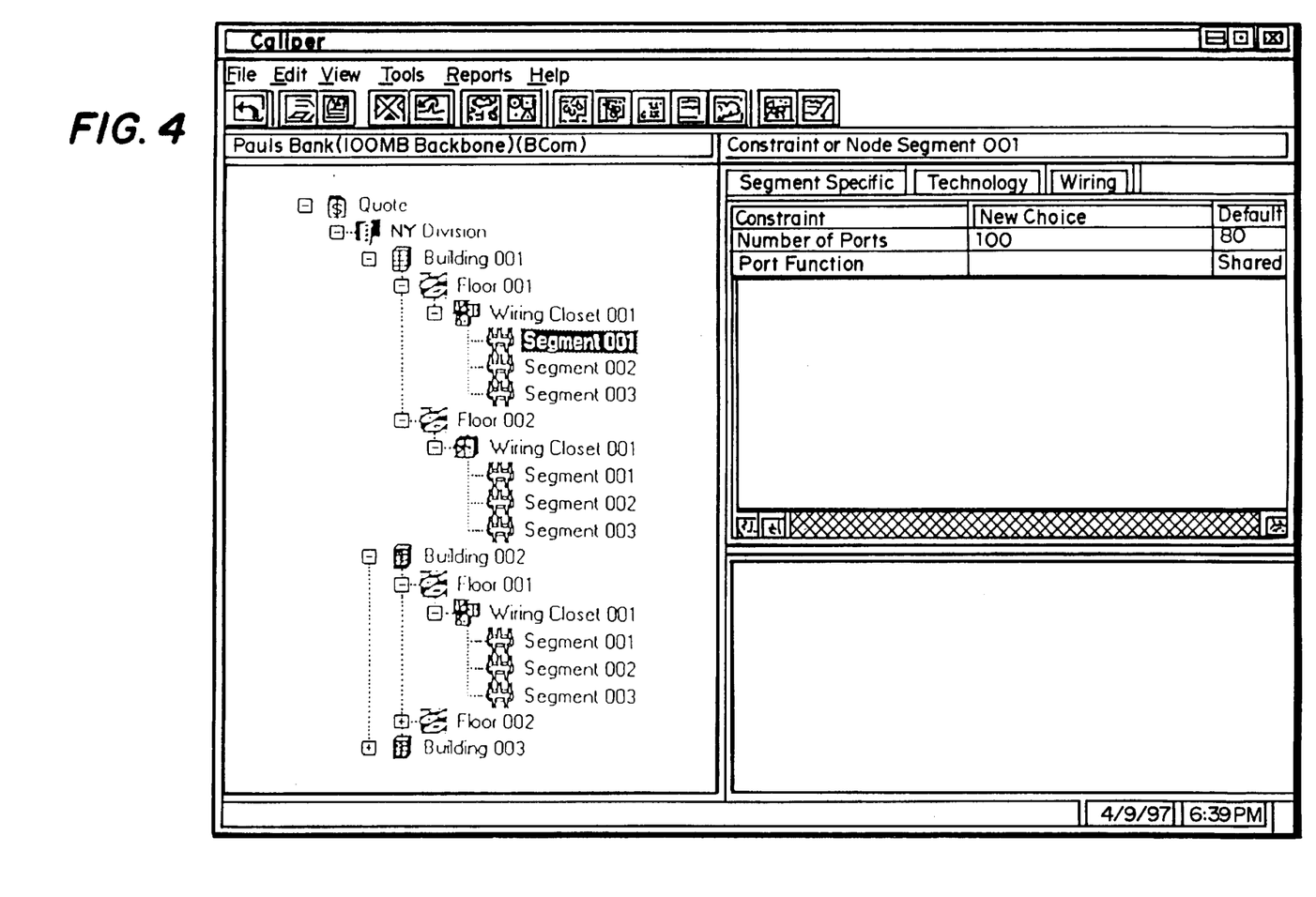
FIG. 4 depicts one working embodiment of an input screen to enter the infrastructure specifications into the present invention.

FIG. 4 depicts one working embodiment of an input screen to enter the infrastructure specifications into the present invention. The figure shows that the site—the NY Division—has three buildings, and the building 001 has two floors, with each floor having a wiring closet and three segments. In this example, a user highlights the segment 001, and enters its infrastructure specifications into the computer 100. One specification is the number of ports in that segment, which is shown to be 100.

Figure 5:
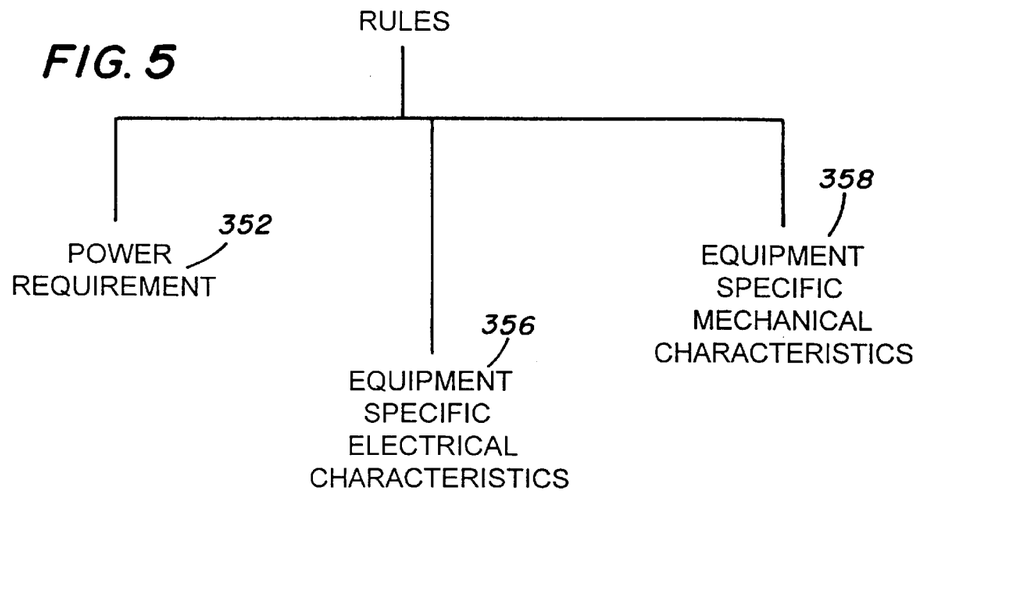
FIG. 5 shows examples of networking rules for the present invention.

The processing device 104 then retrieves (step 204) a set of networking rules. FIG. 5 shows some examples. Different types of network products have different power requirements, and certain types of network products can only supply a specific amount of power. For example, if one installs a number of modules into a chassis, one has to ensure that the chassis can supply sufficient power for all of the modules. Thus, one set of rules is on the power requirement 352 by products in the network.

Another set of rules are related to electrical characteristics 356 and mechanical characteristics 358 of networking products. As examples, BayNetworks 5000-N chassis has 12 back plane segments, contains up to 3 power supply slots, 1 supervisory slots and 14 other slots. It is for an Ethernet network. To operate, it needs at least one power supply and one supervisory modules. Examples of modules include BayNetworks 53XX modules, such as 5380A and 5310. Any of these modules can connect to any of the 12 back plane segments. However, one cannot select a 53XX module for a supervisory slot. Note that pricing information on the products is also stored in the database. These product-specific characteristics are reduced into rules, and are stored in the database 106. Techniques to reduce the characteristics into rules should be obvious to those skilled in the art and will not be further described. In one embodiment, the processing device 104 can query the database to retrieve (step 204) the rules using SQL queries.

Figure 6:
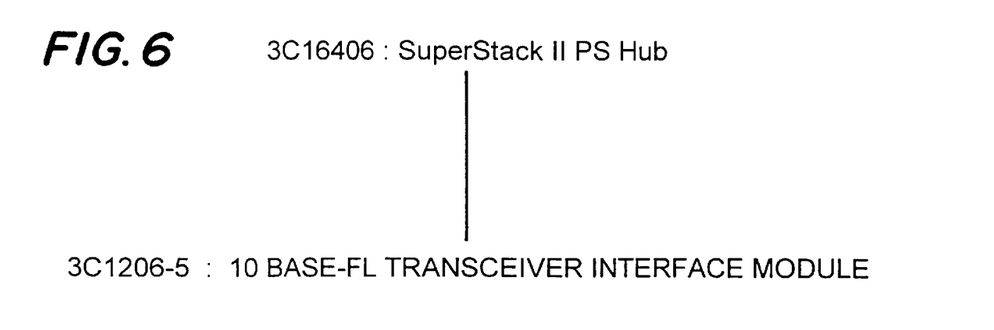
FIG. 6 depicts one working embodiment of containment rules describing the products in a database of the present invention.

The rules on product characteristics can be stored in the database 106 based on a containment model, which shows the relationships among the products, with some of them contained in others. FIG. 6 depicts one working embodiment of containment rules. In this example, a 3Com 3C1206-5 (a 10 BASE-FL TransceiverInterface Module) is contained in a 3Com 3C16406 (a SuperStack II PS Hub). In another example, a Cisco 4500 router chassis contains a router motherboard, which contains specific types and amount of memory required, based on the protocol environment defined.

Figure 7:
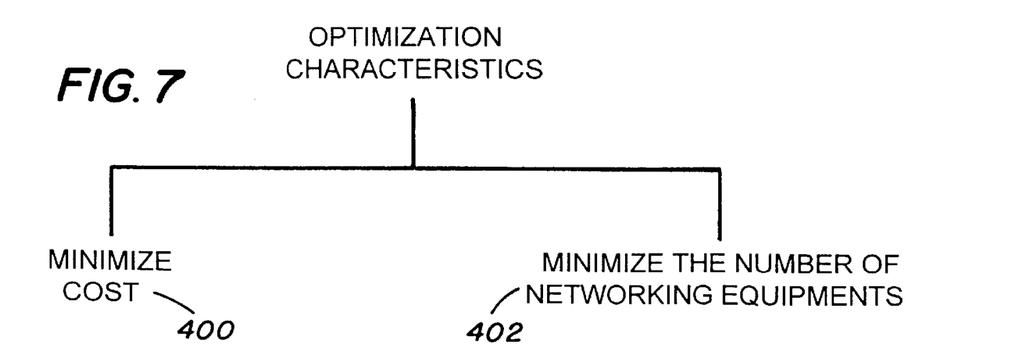
FIG. 7 shows examples of optimization constraints for the present invention.

The computer 100 also retrieves (step 206) one or more networking optimization constraints from the database 106. FIG. 7 shows examples of some of these constraints. One optimization constraint can be that the design implemented is of substantially the minimal cost 400. Another constraint can be that the design implemented has substantially the minimum number of parts 402.

After retrieving the infrastructure specifications, the processing device 104 validates them (Step 207) to decide if all of the essential specifications have been entered. This step is based on a few networking rules. For example, if the building datacenter has not been specified, the validation process fails, and the design stops. The processing device 104 may alert the user, and ask the user to re-enter the missing essential specification.

Figure 8:
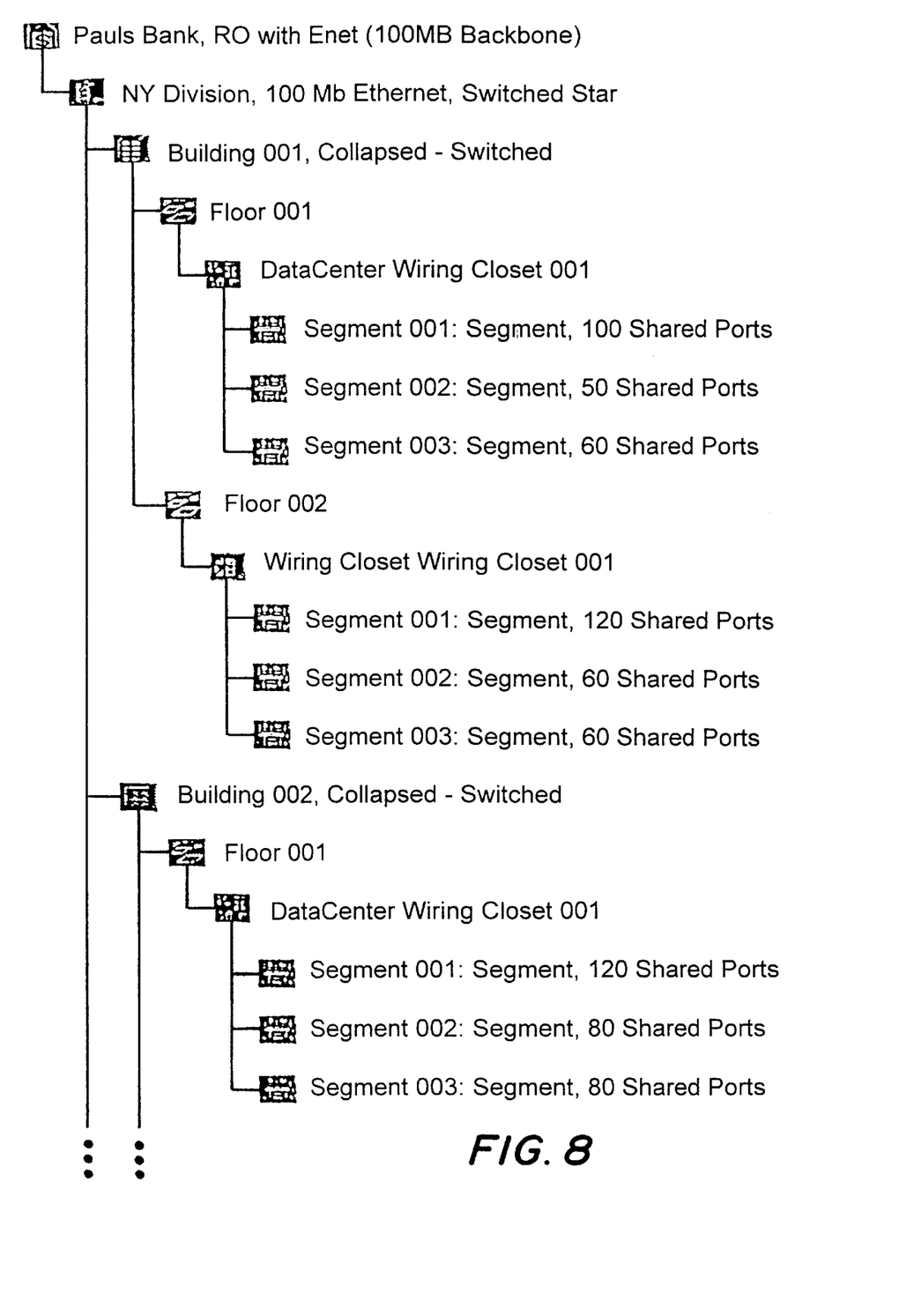
FIG. 8 depicts one example of a design defining characteristics of the desired products of a network based on the present invention.

Based on at least the infrastructure specifications, the processing device 104 generates a design that defines characteristics needed in the products of the desired network. In one embodiment, the design defines at least one characteristic in each of the desired products of the network. FIG. 8 shows such a design. Typically, this is the problem definition step, where characteristics in each of the desired products in the network are defined. For example, as shown in FIG. 8, the segment 001 in the datacenter wiring closet 001 on floor 001 of building 001 houses 100 shared ports. There are many other characteristics that are not shown in the figure, such as a product may be a twisted pair hub from 3Com. For some of the desired products, some of their characteristics need not be defined by the user. Then, default values are used, which again can be represented as networking rules. The technique to generate a hierarchy, just as the one shown in FIG. 8, should be obvious to those skilled in the art and will not be further described.

The processing device 104 then checks (step 210) the characteristics of the desired products in the design to decide whether there are products in the database 106 that can satisfy them. For example, if one set of characteristics calls for a 24-port hub that supports a 10 megabit-per-second Ethernet network, the computer searches in the database to determine if such a product exists. The processing device 104 compares the characteristics in each of the desired products in the design with those in the database 106. If the processing device 104 cannot find any product in the database satisfying the characteristics of a desired product in the design, the computer can ask the user to change the specifications, or can simply provide an error message to alert the user. If in response, the user changes an infrastructure specification, the processing device 104 repeats from the step of generating another design (step 208) for the network.

If the processing device 104 determines that there are products in the database that satisfy the characteristics of each of the desired products in the design, the processing device 104 proceeds to select (step 212) products to implement the design. In one embodiment, the implementation at least specifies one communication characteristic between two of the products to be housed in two physical locations. In this application, two products in two physical locations imply the two products are not in one box or chassis.

The selection process depends on the networking rules. For example, a part of the design in FIG. 8 calls for a segment with 100 ports in an Ethernet network, with the product manufactured from 3Com and the interconnecting medium being twisted pairs. The product that satisfies these characteristics can be five of the 24-Port TP Hub from 3Com's SuperStack II Hub 10 family. Also, another part calls for three of such segments to be connected to a datacenter wiring closet. The product to be used has the additional characteristics of a 100 MB switched Ethernet with fiber interconnects from 3Com. The product selected can be a 3Com SuperStack II Switch 1000 with a 10 Mbps transceiver interface module based on ST fiber. Techniques to implement such rule-based selection process should be obvious to those skilled in the art and will not be further described.

For each product in the design, the processing device 104 selects all the products in the database that satisfy its characteristics. In the above examples, only one product has been identified for each selection. However, if there are more than one products in the database that satisfy the characteristics, the selection process further includes the step of optimization based on one or more optimization constraints.

In one embodiment, the optimization process depends on an operation research solution engine whose implementation should be obvious to those skilled in the art. The optimization can be based on minimizing the cost of implementing the design, or can be based on one or more other optimization constraints. Another constraint can be minimizing the number of products in the design because some products can be combined with other products and sold as a bundled unit. Under this condition, even if there is only one product selected for each product in the design, the processing device 104 still performs the optimization process.

After the selection (step 212), the report generation device 108 can generate (step 220) network reports, and the graphics generation device 112 can generate (step 218) network diagrams describing the network.

Figure 9:
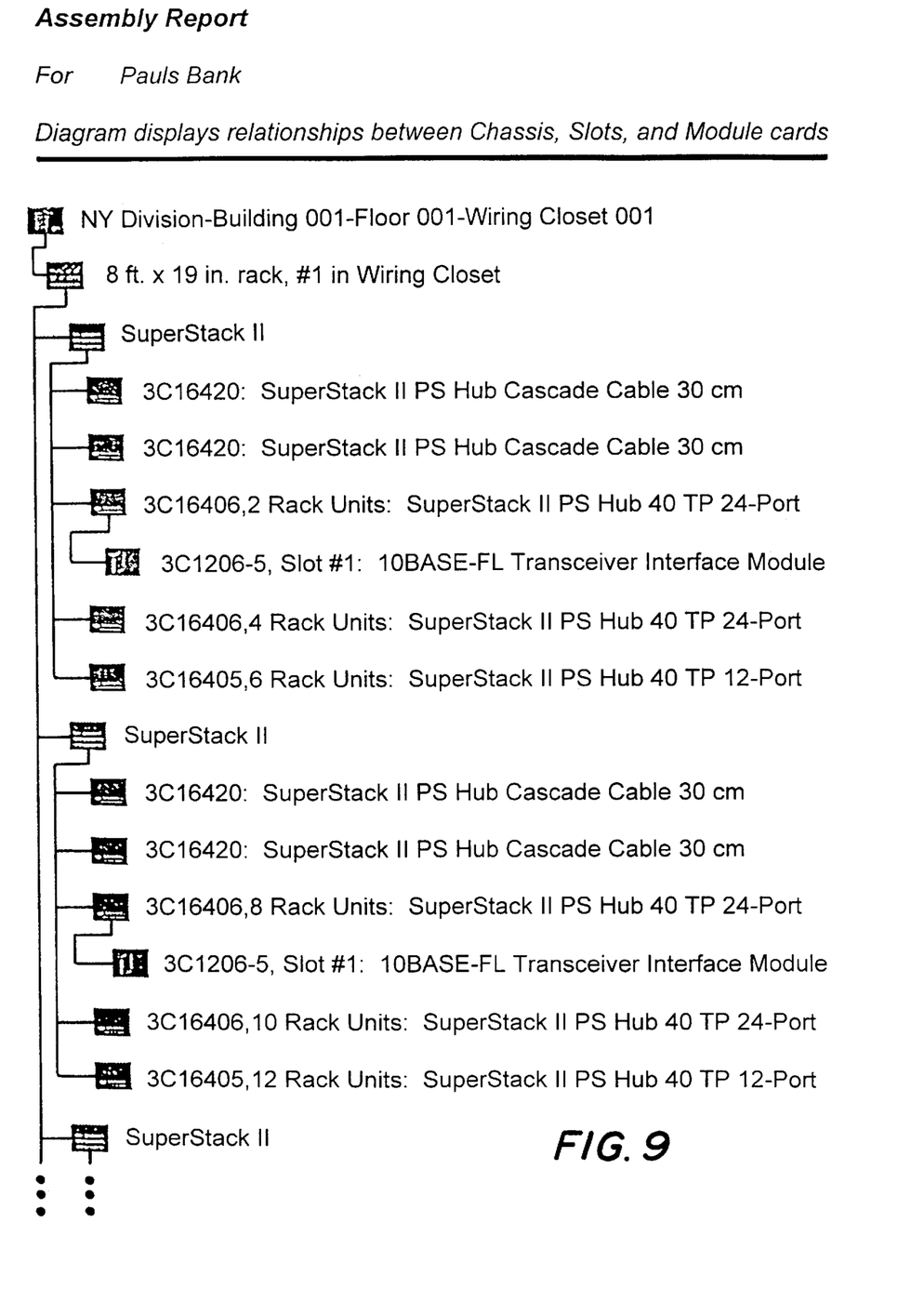
FIG. 9 depicts one example of a working embodiment of a network assembly report based on the present invention.
Figure 10:
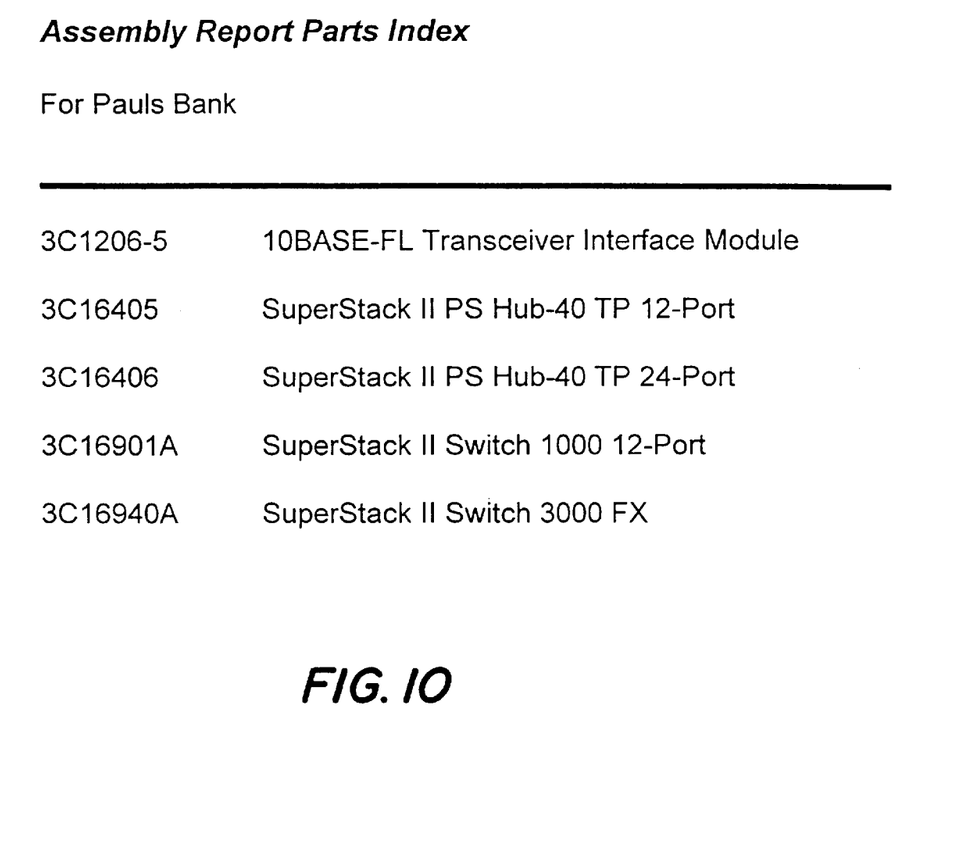
FIG. 10 depicts one example of a working embodiment of a network parts index based on the present invention.
Figure 11:
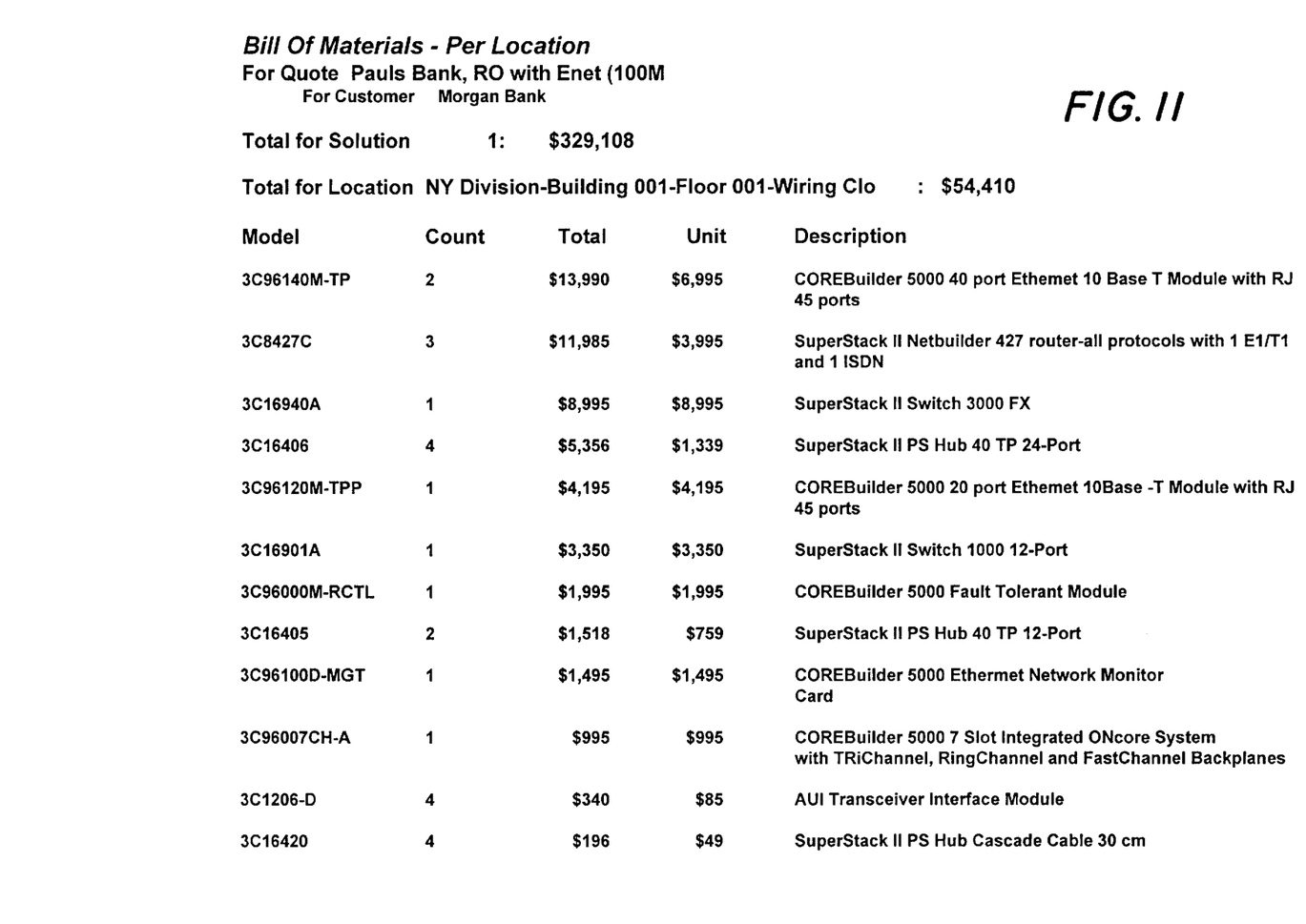
FIG. 11 depicts one working embodiment of a bill of materials based on the present invention.
Figure 12:
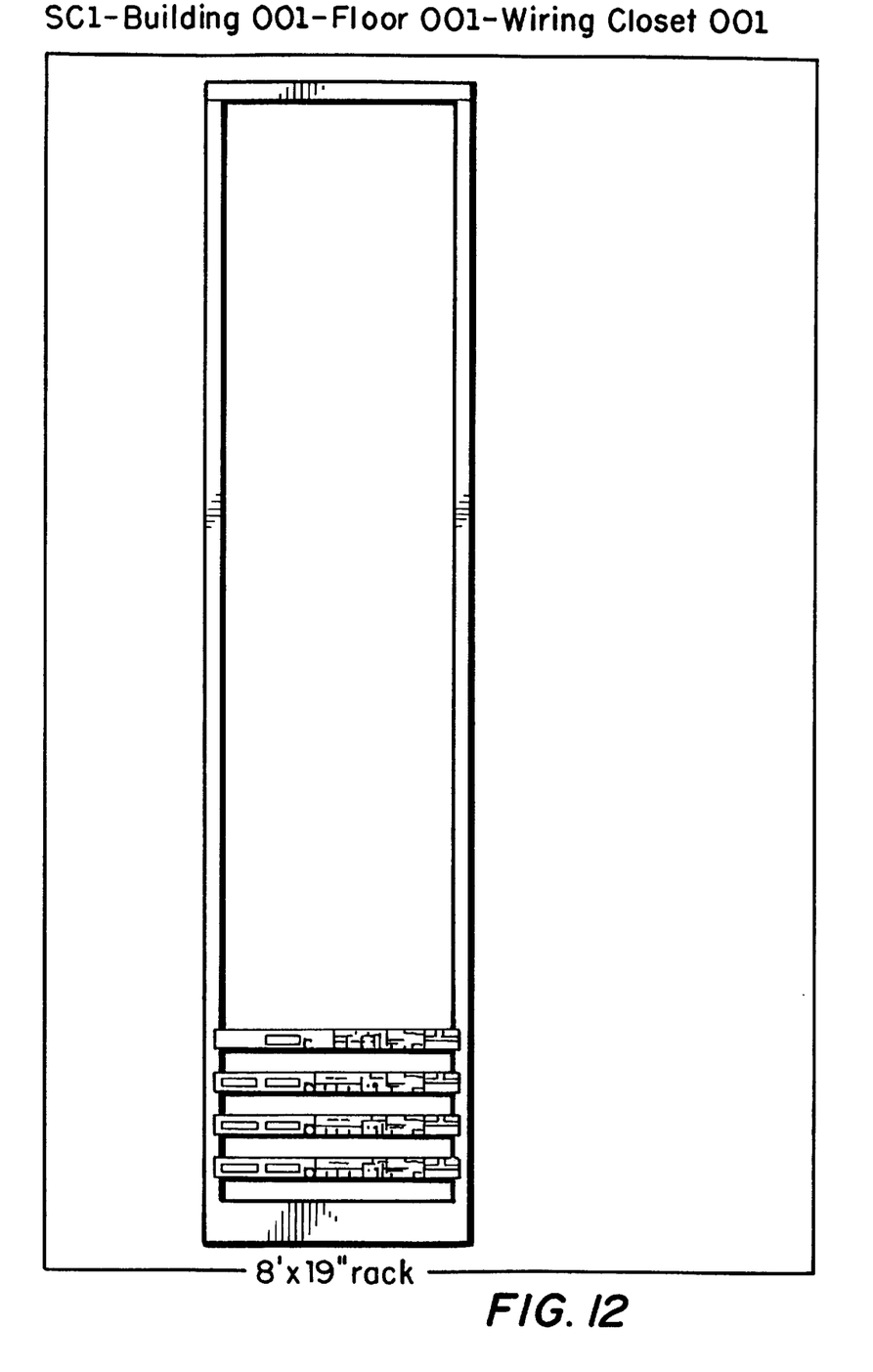
FIG. 12 depicts one working embodiment of a network assembly diagram based on the present invention.

FIG. 9 depicts one example of a working embodiment of a network assembly report showing how the products should be assembled. Using the report, a technician with minimal networking experience can put together the network. FIG. 10 depicts one example of a working embodiment of a network parts index providing descriptions for each of the parts in the network. FIG. 11 depicts one working embodiment of a bill of materials for the network; other types of bill of material are also applicable, for example, a bill of materials for a physical location and a bill of materials for a specific network segment. FIG. 12 depicts one working embodiment of a network assembly diagram, showing a number of products mounted in a wiring closet on a floor of one building, depicting how they look and how they should be installed. Other figures can also be available, which indicate, for example, more detailed network layout diagrams and wiring diagrams even down to the port level of the network designed. Techniques to draw such reports and figures from data should be obvious to those skilled in the art and will not be further described.

The design process can be repeated. In one embodiment, one can enter additional specifications into the computer 100. Then the processor 104 can retrieve (step 216) the additional specifications, and repeat from the step of generating a design (step 208) to be implemented. In another embodiment, one can modify the design by entering changes into the computer 100. For example, after selecting all of the products, the user can access the input screen, as shown in FIG. 4, and change some of the inputs. The processor 104 can retrieve (step 214) the modifications, and repeat from the step of generating a design (step 208) to be implemented.

One can use the invention to modify or enhance the performance of an existing network For example, one can enter the characteristics of the products in the existing network into the computer 100. Then one can change or add additional infrastructure specifications and use the present invention to re-design a new network by starting at step 204 in FIG. 2. In another example, the modification process may be used to compare designs based on products from different vendors.

FIG. 1 describes one type of computer implementing the invention. Other embodiments are also applicable. For example, in another embodiment, the storage medium holding the database 106 is distributed—the rules are stored remotely in a server computer memory, other information, such as the infrastructure specifications, is stored locally.

FIG. 2 describes one set of steps to implement the present invention. Other approaches are also applicable. For example, in another embodiment, the set of steps does not include the step of validating (step 207) infrastructure specifications, and checking (step 210) for products. In yet another embodiment, the steps include the step of validating (step 207), with the step of retrieving additional specifications (step 216) and retrieving design modification (step 214) repeating from that step of validating infrastructure specifications(step 207). In a further embodiment, the steps are not restricted to be in the sequence shown in FIG. 2. For example, the steps of retrieving networking rules (step 204) and retrieving networking optimization constraints (step 206) are at different locations, such as after the step of validating infrastructure specifications (step 207).

As described above, the implemented design at least specifies one communication characteristic between two of the products to be housed in two physical locations. The two locations can be two separate floors in a building, or two different sites: one in NY, the other in CA. One characteristic can be the type of connection, or the availability of bandwidth. For example, if the type of connection is T1, the bandwidth available is higher than if the type of connection is ISDN; and if the type of connection is wireless, the connection needs an antenna Another characteristic can be the nature of the connection, which can be in a fully meshed topology or a star topology or others. A further communication characteristic can specify the level of redundancy, such as one or two levels. Yet another characteristic can be the communication protocol, such as IP, IPX or XNS.

One other characteristic is the tariff levied on the information transmitting. The tariff depends on a number of factors, such as the distance to travel, the service provider, the States or countries the products are in, and the connectivity available. For example, if the transmission has to go through optical fibers controlled by AT&T or MCI across a number of states, there might be many options with different tariffs. One set of networking rules—the connectivity rules—specifies the connectivity paths between sites, the service providers available for those paths and their rates, which may vary across states. Assume that a user wants to minimize the tariff for transmitting information between two sites. Based on the connectivity rules, the processing device 104 searches for all of the connectivity paths in its database that can transmit information between the two sites. If there are more than one options, the processing device 104 can optimize based on different constraint. In this example, the constraint is to minimize the tariff one has to pay. Based on the constraint, the processing device 104 selects the connectivity paths and reports on their characteristics, including the tariff.

The rules specifying the connectivity paths depend on designating the endpoints of the connectivity paths. One approach is to designate the zip codes, or area codes with prefixes of phone numbers, or other types of easily accessible information. In other words, the endpoints are represented, for example, by zip codes. By entering the zip codes, a user has specified the site location. Then the processing device 104 can retrieve the corresponding connectivity rules to identify all of the available paths, and optimize them, if necessary.

Another characteristic is the number of hops a signal has to go through from one endpoint to the next. For example, a user can specify that information can only go through two hops between two locations. The processing device 104, based on the connectivity rules, searches for the appropriate path. There might be more than one options. Then, the option selected would again depend on other rules and constraints. Such searching and optimizing techniques should be obvious to those skilled in the art, and will not be further described.

For clarity, the above description analyzes the situation for two sites. The invention can be extended to many sites or locations.

With the connectivity paths and networking information on the connectivity paths determined, one can generate a graphical representation of the entire network, showing the connectivity paths among the sites, and the networking information of the paths and in the sites. This is known as the enterprise network. The enterprise network can overlay on the map of the United States, or the world, with sites and their connectivity shown. A user can identify any site and activate it with a mouse. Then the information in that site can be displayed. The information can be those described above, such as the number of floors, the product identifiers etc.

Also the graphical representations of the enterprise network can be selective. For example, a user can ask for a graphical representation of all parts of the network that has got IP (internet protocol) and that uses token ring as the LAN technology. The processing device 104 will select the part of the network with such characteristics and represent them graphically to the user.

Other embodiments of the invention will be apparent to those skilled in the art from a consideration of this specification or practice of the invention disclosed herein. It is intended that the specification and examples be considered as exemplary only, with the true scope and spirit of the invention being indicated by the following claims.

We claim:

1. A computer-aided-design method for generating a design of desired products for a network, and selecting products to implement the design, the method comprising the steps of:

retrieving by a computer a plurality of infrastructure specifications of the network, the specifications including at least one physical location previously entered by a user to house the network, and with at least one of the infrastructure specifications based on a default value previously stored in the computer;

retrieving by the computer at least one networking rule;

generating by the computer a design that defines characteristics in at least one desired product of the network, based on at least the infrastructure specifications; and selecting by the computer at least one networking product from a storage medium, based on the rule and the specifications, to implement the design of the network;

such that based on the infrastructure specifications previously entered by the user, the computer can automatically select the at least one networking product and generate a list including the at least one networking product to implement the design of the network.

2. A method as recited in claim 1 wherein the implemented design of the network at least specifies one communication characteristic between two of the products to be housed in two physical locations.

3. A method as recited in claim 1 wherein after the step of selecting, the method further comprises the step of generating a network assembly diagram depicting the network.

4. A method as recited in claim 1 wherein after the step of selecting, the method further comprises the step of generating a bill of materials for the network.

5. A method as recited in claim 1 wherein:

after the step of retrieving by a computer, the method further comprises the step of retrieving by the computer at least one networking optimization constraint; and the step of selecting also depends on an optimization process using the at least one constraint.

6. A method as recited in claim 1 wherein after the step of generating a design, the method further comprises the step of checking by the computer whether there are products in a storage medium satisfying the design.

7. A method as recited in claim 1 wherein one specification is the technology of the network.

8. A method as recited in claim 1 wherein one specification is whether the products to be selected are modular or non-modular.

9. A method as recited in claim 1 wherein one specification is the company supplying the products.

10. A method as recited in claim 1 wherein:

one specification is the company supplying the products; and another specification is the maximum price discount for these products.

11. A method as recited in claim 1 wherein one rule is on the power requirement of a product in the network.

12. A method as recited in claim 5 wherein one optimization constraint is to minimize the cost of the network.

13. A method as recited in claim 5 wherein one optimization constraint is to minimize the number of networking products for the network.

14. A method as recited in claim 1 further comprising the steps of:

retrieving by the computer modifications made on the implemented design network; and repeating from the step of generating by the computer a design in view of the modifications.

15. A method as recited in claim 1 further comprising the steps of:

retrieving by the computer additional specifications on the network; and repeating from the step of generating by the computer a design in view of the additional specifications.

16. A method as recited in claim 1 wherein the computer is a portable computer.

17. A method as recited in claim 16 wherein the input/output mechanism of the computer is through web-based technology.

18. A method as recited in claim 2 wherein one communication characteristic is the type of connection.

19. A method as recited in claim 2 wherein one communication characteristic is the nature of the connection.

20. A method as recited in claim 2 wherein one communication characteristic is the tariff levied on the information transmitting.

21. A method as recited in claim 1 wherein one type of physical locations is designated by its zip codes.

22. A method as recited in claim 1 wherein based on the design implemented, the method can generate a graphical representation depicting at least the connectivity paths among the physical locations of the network.

23. A method as recited in claim 2 wherein based on the design implemented, the method can generate a graphical representation depicting at least the connections among the physical locations of the part of the network with the communication characteristic.

24. An apparatus for generating a design of desired products for a network, and selecting products to implement the design, the apparatus comprising;

a memory device for storing a plurality of infrastructure specifications of the network, including at least one physical location previously entered by a user through an input device to house the network, and with at least one of the infrastructure specifications based on a default value previously stored in the device; and a processing device for retrieving the infrastructure specifications of the network from the memory;

retrieving at least one networking rules;

generating a design that defines characteristics in at least one desired product of the network, based on at least the infrastructure specifications; and selecting at least one networking product from a storage medium based on the rules and the specifications, to implement the design of the network;

such that based on the infrastructure specifications previously entered by the user, the apparatus can automatically select the at least one networking product and generate a list including the at least one networking product to implement the design of the network.

25. An apparatus as recited in claim 24 further comprising a graphics generation device to generate a network assembly diagram depicting the network.

26. An apparatus as recited in claim 24 further comprising a report generation device to generate a bill of materials for the network.

27. An apparatus as recited in claim 24 wherein:
the processing device further retrieves at least one networking optimization constraint; and
the selecting step by the processing device also depends on an optimization process using the at least one constraint.

28. An apparatus as recited in claim 24 wherein the processing device also checks whether there are products in the database satisfying the design.

* * * * *